(12) United States Patent
Griswold et al.

(10) Patent No.: US 10,281,547 B2
(45) Date of Patent: May 7, 2019

(54) DIFFUSION-WEIGHTED DOUBLE-ECHO MAGNETIC RESONANCE FINGERPRINTING (MRF)

(71) Applicant: Case Western Reserve University, Cleveland, OH (US)

(72) Inventors: Mark Griswold, Shaker Heights, OH (US); Vikas Gulani, Shaker Heights, OH (US); Dan Ma, Cleveland, OH (US); Yun Jiang, Cleveland Heights, OH (US); Katherine Wright, Macedonia, OH (US)

(73) Assignee: Case Western Reserve University, Cleveland, OH (US)

( * ) Notice: Subject to any disclaimer, the term of this patent is extended or adjusted under 35 U.S.C. 154(b) by 1235 days.

(21) Appl. No.: 14/257,207

(22) Filed: Apr. 21, 2014

(65) Prior Publication Data
US 2015/0301142 A1    Oct. 22, 2015

(51) Int. Cl.
| *G01R 33/56* | (2006.01) |
| *G01R 33/48* | (2006.01) |
| *G01R 33/36* | (2006.01) |
| *G06T 7/00* | (2017.01) |
| *G01R 33/563* | (2006.01) |

(52) U.S. Cl.
CPC ..... *G01R 33/5608* (2013.01); *G01R 33/4828* (2013.01); *G01R 33/56341* (2013.01)

(58) Field of Classification Search
CPC ............ G01R 33/4828; G01R 33/5608; G01R 33/56341; G01R 33/50; G01R 33/448; G01R 33/5611; G01R 33/5612; G01R 33/4625; G01R 33/54
See application file for complete search history.

(56) References Cited

U.S. PATENT DOCUMENTS

| 8,723,518 B2 | 5/2014 | Seiberlich et al. |
| 2014/0167754 A1* | 6/2014 | Jerecic ............... G01R 33/561 324/309 |

(Continued)

OTHER PUBLICATIONS

Jiang, Yun, et al. "Simultaneous T1, T2, diffusion and proton density quantification with MR fingerprinting." Magn. Reson. Imaging 38.1 (2014): 173-9.*

(Continued)

*Primary Examiner* — Rishi R Patel
(74) *Attorney, Agent, or Firm* — Quarles & Brady LLP

(57) ABSTRACT

Apparatus, methods, and other embodiments associated with NMR fingerprinting are described. One example NMR apparatus includes an NMR logic that repetitively and variably samples a (k, t, E) space associated with an object to acquire a set of NMR signals that are associated with different points in the (k, t, E) space. Sampling is performed with t and/or E varying in a non-constant way. Sampling is performed in response to a diffusion-weighted double-echo pulse sequence. Sampling acquires transient-state signals of the double-echo sequence. The NMR apparatus may also include a signal logic that produces an NMR signal evolution from the NMR signals, and a characterization logic that characterizes a resonant species in the object as a result of comparing acquired signals to reference signals.

32 Claims, 17 Drawing Sheets

(56) References Cited

U.S. PATENT DOCUMENTS

2015/0070012 A1  3/2015  Griswold
2016/0154078 A1  6/2016  Grodzki

OTHER PUBLICATIONS

D. Ma, et al.,"Magnetic Resonance Fingerprinting", Nature, Mar. 14, 2013, 187-192, 495-7440, Macmillan Publishers Limited, United States.

B.A. Garner, Modem Legal Use, A Dictionary of Modern Legal Usage, 1995, 624, 2, Oxford University Press Inc., Oxford.

J.A. McNab et al., Steady-state diffusion-weighted imaging: theory, acquisition, and analysis, NMR Biomedical, Aug. 2010, 781-793, 23-7, John Wiley & Sons Inc, United States.

M. Weigel et al., Extended phase graphs with anisotropic diffusion, Journal of Magnetic Resonance, Aug. 2010, 276-285, 205-2, John Wiley & Sons Inc, United States.

I. Lavdas et al., A phantom for diffusion-weighted MRI (DW-MRI), Journal of Magnetic Resonance Imaging, Apr. 10, 2013, 173-179, 38-1, John Wiley & Sons Inc, United States.

Y. Jiang et al., Simultaneous T1 T2 diffusion and proton density quantification with MR fingerprinting, Magnetic Resonance Imaging, 2014, 173-179, 38-1, Int. Soc. Mag. Reson. Med., United States.

\* cited by examiner

US 10,281,547 B2

DIFFUSION-WEIGHTED DOUBLE-ECHO MAGNETIC RESONANCE FINGERPRINTING (MRF)

FEDERAL FUNDING NOTICE

This invention was made with government support under the grant EB017219 awarded by the National Institutes of Health. The government has certain rights in the invention.

BACKGROUND

In the field of magnetic resonance imaging (MRI), attempts have been made to use diffusion-weighted steady-state free precession (DW-SSFP) to estimate the apparent diffusion coefficient (ADC). See, for example, McNab J A, Miller K L. *NMR Biomed.* 2010; 23(7):781-93. Unfortunately, measuring diffusion using DW-SSFP is highly dependent on the relaxation parameters (e.g., T1 spin-lattice relaxation, T2 spin-spin relaxation), which therefore requires additional acquisitions and processing to quantify T1 and T2. Conventional magnetic resonance (MR) pulse sequences include repetitive similar preparation phases, waiting phases, and acquisition phases that serially produce signals from which images can be made. The preparation phase determines when a signal can be acquired and determines the properties of the acquired signal. For example, a first pulse sequence may produce a T1-weighted signal at a first echo time (TE) while a second pulse sequence may produce a T2-weighted signal at a second TE. These conventional pulse sequences typically provide qualitative results where data are acquired with various weightings or contrasts that highlight a particular parameter (e.g., T1 relaxation, T2 relaxation). Conventional MR pulse sequences may not recover of a free induction decay (FID).

When MR images are generated, they may be viewed by a radiologist and/or surgeon who interprets the qualitative images for specific disease signatures. The radiologist may examine multiple image types (e.g., T1-weighted, T2-weighted) acquired in multiple imaging planes to make a diagnosis. The radiologist or other individual examining the qualitative images may need particular skill to be able to assess changes from session to session, from machine to machine, and from machine configuration to machine configuration. Thus, the images are only as good as the image interpreter and all image based (e.g., qualitative) diagnoses end up being subjective. Thus, techniques like DW-SSFP have attempted to quantify some MR information (e.g., apparent diffusion co-efficient).

Magnetic resonance fingerprinting (MRF) employs a series of varied sequence blocks that simultaneously produce different signal evolutions in different resonant species (e.g., tissues) to which the RF is applied. The term "resonant species", as used herein, refers to an item (e.g., water, fat, tissue, material) that can be made to resonate using NMR. By way of illustration, when RF energy is applied to a volume that has bone and muscle tissue, then both the bone and muscle tissue will produce an NMR signal. However the "bone signal" and the "muscle signal" will be different and can be distinguished using MRF. The different signals can be collected over a period of time to identify a signal evolution for the volume. Resonant species in the volume can then be characterized by comparing the signal evolution to known evolutions. Characterizing the resonant species may include identifying a material or tissue type, or may include identifying MR parameters associated with the resonant species. The "known" evolutions may be, for example, simulated evolutions or previously acquired evolutions. A large set of known evolutions may be stored in a dictionary.

Characterizing the resonant species can include identifying different properties of a resonant species (e.g., T1, T2, diffusion resonant frequency, diffusion co-efficient, spin density, proton density). Additionally, other properties including, but not limited to, tissue types, materials, and super-position of attributes can be identified. These properties may be identified simultaneously using MRF, which is described in U.S. patent application "Nuclear Magnetic Resonance (NMR) Fingerprinting", application Ser. No. 13/051,044, and in *Magnetic Resonance Fingerprinting*, Ma et al., Nature 495, 187-192 (14 Mar. 2013), the contents of both of which are incorporated herein by reference.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
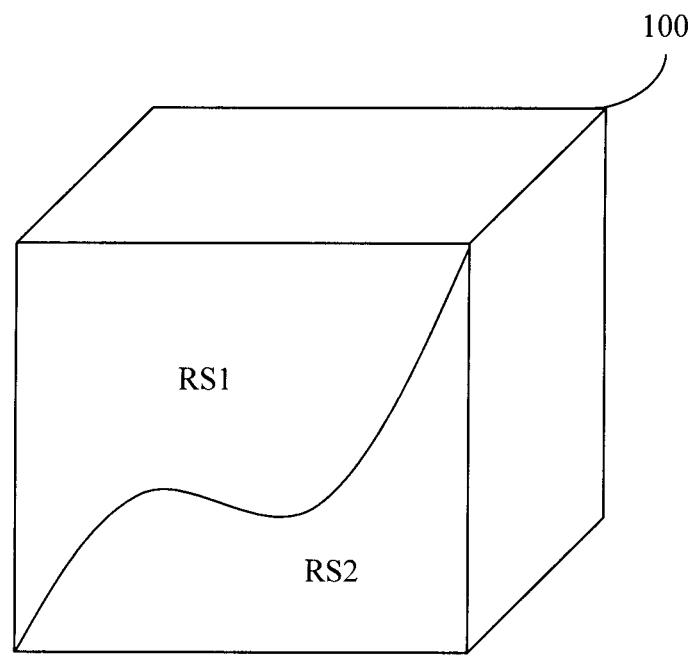
FIG. 1 illustrates a volume that contains two resonant species.

Example apparatus and methods simultaneously quantitatively map magnetic resonance (MR) parameters retrieved from magnetic resonance fingerprinting (MRF) in response to a diffusion weighted double echo (DWDE) pulse sequence that acquires both a free induction decay (FID) signal and a spin echo signal in a single repetition time (TR). Example apparatus and methods may simultaneously produce quantitative data for an apparent diffusion co-efficient (ADC) and other MR parameters (e.g., T1, T2, proton density) by acquiring the transient-state signals of the DWDE pulse sequence. Quantitative maps may be produced from the quantitative data.

MRF simultaneously provides quantitative maps of multiple MR parameters. Observed signal evolutions are matched to dictionary entries using, for example, template matching or other matching or comparing processes. In one example matching process, the inner product is computed between a noisy acquired signal and entries in a dictionary to find the stored signal evolution to which an acquired signal evolution most closely matches. In other examples, other pattern matching or similarity finding approaches are performed. Values for MR parameters related to the dictionary entry that matched the acquired noisy signal may then be retrieved. In one example, MR parameters may be stored in the dictionary, while in another example MR parameters may be stored in a data store separate from the dictionary. Example MRF efficiently generates multiple quantitative maps by matching dictionary entries to transient-state signals acquired in response to the DWDE pulse sequence.

In one embodiment, the dictionary may be formed using the Bloch equations to simulate signal evolutions using different combinations of T1 relaxation times, T2 relaxation times, off-resonance frequencies, diffusion gradient moments, or other factors. In NMR, MRI, or ESR (electron spin resonance), a Bloch equation is a member of a set of macroscopic equations that are used to calculate the nuclear magnetization $M=(M_x, M_y, M_z)$ as a function of time when relaxation times T1 and T2 are present. These phenomenological equations were introduced by Felix Bloch and may also be referred to as the equations of motion of nuclear magnetization. In one embodiment $Ri(\alpha)$, $R_{RFij}(\alpha,\phi)$, and $R(G)$ may be viewed as Bloch equations, where $Ri(\alpha)$ is a rotation due to off resonance, $R_{RFij}(\alpha,\phi)$ is a rotation due to RF differences, and $R(G)$ is a rotation due to a gradient.

Example apparatus and methods may denote the MRF dictionary by $D \in C^{n \times t}$, where n is the number of parameter combinations and t is the number of time points. Example apparatus and methods may denote by $d_j$, $j=1, \ldots, n$ the jth row of D. The dictionary match for an observed noisy signal evolution may be determined by a process similar to query or template matching. For example, the observed signal evolution, denoted x, may be compared to dictionary entries by using the complex inner product. The complex inner product may determine which entry in the dictionary matches the signal evolution with highest probability. A dictionary entry $d_l$ may be chosen that satisfies:

$$d_l = \arg\max_{1 \le j \le n} |d_j x|$$

where x denotes the vector x and | | represents the modulus. Once the match has been discovered, example apparatus and methods may assign to the material that generated the signal the MR parameters (e.g., T1, T2, off-resonance, ADC) associated with the matching entry in the dictionary. In one embodiment, MR parameters associated with dictionary entries may be stored in the dictionary.

In another embodiment, MR parameters associated with dictionary entries may be stored outside the dictionary but may be retrievable using a dictionary entry or dictionary entry identifier. While an inner product and template match are described, other matching or comparing processes may be used to identify a dictionary entry that is related to an acquired signal evolution.

A brief review of MRI and MRF facilitates understanding the example apparatus and methods described herein. Larger objects like human bodies are made up of smaller objects like arms and legs and hips. The smaller objects are in turn made up of smaller parts like skin, muscle, fat, bone, tendon, and prosthetics. These smaller parts are in turn made up of even smaller things like water and minerals. The water and minerals are themselves made up of even smaller things (e.g., hydrogen, oxygen) which in turn are made up of even smaller things (e.g., electrons orbiting a nucleus). The nucleus may include a proton that exhibits "spin". A human body has a large number of protons and thus a large number of spins.

In the presence of a magnetic field provided during magnetic resonance imaging (MRI), some of the spins will align in one direction (e.g., N/S) with respect to that magnetic field while other spins will align in an opposite direction (e.g., S/N) with respect to that magnetic field. MRI manipulates the magnetic field so that a net alignment in one direction is achieved. MRI further manipulates the magnetic field so that local differences in the field are achieved to allow spatial encoding. For example, x, y, and z gradients may be applied to create local variations in the larger magnetic field. The local variations allow the excitation of some spins without the excitation of other spins. Selective excitation is possible because of the Larmor relationship between magnetic fields and spins. The Larmor relationship describes how the frequency at which spins accept RF energy is related to the magnetic field in which the spins are located.

With the local variations created, RF energy may be applied to selected sets of spins associated with a local variation to make those spins behave in a certain way. For example, spins may be forced into a high energy state and forced away from their default alignment. When the RF energy is removed, the spins may return or may be forced to return to their default alignment. Different spins may return to their default alignment at different rates. Similarly, spins may return to their default alignment for different reasons. As the spins return from the forced alignment to the natural alignment, the spins produce a signal that can be detected for a short period of time.

MRF manipulates the magnetic field and manipulates the application of RF energy at different frequencies. NMR fingerprinting may employ pseudo-random routines that allow a volume to produce the signal(s) the volume is going to produce in response to a variety of changing conditions created by a variety of changing applications of RF energy. In one embodiment, NMR fingerprinting then compares a signal that evolves from the received signals to known signals received from other acquisitions at other times under similar conditions or to a set of simulated expected or predicted signal evolutions (e.g., curves). If the received signal evolution matches or can be fit to within a threshold of a known, simulated, or predicted signal evolution, then the volume that generated the signal evolution likely holds the same number, type, and mixture of spins as the volume that produced the matched or fitted signal evolution. Over time, signals associated with normal tissues, normal structures, normal materials (e.g., cerebrospinal fluid (CSF)), abnormal tissues, abnormal structures, or abnormal materials (e.g., compromised CSF) may be acquired and stored. MR parameters associated with those known stored signals may also be stored and related to dictionary entries. Thus, acquired NMR signals can be compared to the stored signals to determine whether the acquired NMR signals are associated with, for example, normal tissue or abnormal tissue.

More generally, first information associated with NMR signals acquired in response to NMR fingerprinting excitation is compared to second information associated with reference responses to NMR fingerprinting excitation to characterize a property of a material subjected to the NMR fingerprinting excitation. Unlike conventional MRI, example MRF facilitates simultaneously querying T1, T2, M0, where M0 is the default or natural alignment to which spins align when placed in the main magnetic field, ADC, and other MR parameters following a single pseudo-randomized acquisition that employs a DWDE pulse sequence.

The frequency at which water in a volume will accept RF energy is determined by the magnetic field in which the water is located. The frequency can be computed when the magnetic field is known. The frequency at which fat in the same volume will accept RF energy is also determined by the magnetic field in which the fat is located. This frequency can also be computed when the magnetic field is known. Thus, applying multiple frequencies can induce multiple resonant species to resonate. Applying the multiple frequencies under a series of different conditions at different times can cause the resonant species to resonate in different ways. Additionally, applying the multiple frequencies under different conditions at different times can cause the resonant species to resonate and relax in different ways. The different resonations and different relaxations may yield a unique signal evolution for a combination of resonant species. Since the frequency is determined by the magnetic field, the magnetic field may be determined when the frequency is known by analyzing a received signal in light of reference signals.

If a volume only has water, then the volume will only produce one signal. If the volume only has fat, then the volume will also only produce one signal, but it will be a different signal. Different amounts of fat and water in the same volume will yield different signals. The combination of signals acquired under different conditions may yield nearly infinitely unique signal evolutions. While the human body is a complicated thing, from a certain point of view it is not that complicated. Every volume in a human body can only hold a finite set of things arranged in a finite set of ways. Over time, a comprehensive library of reference information including, but not limited to, signal evolutions associated with many of the most relevant combinations of resonant species may be acquired and be available to NMR fingerprinting apparatus. The library may store signals that may be referred to as baseline signatures or known signal evolutions. In different embodiments, the library may store simulated and/or predicted signal evolutions. Thus in different examples, "known" signal evolutions may include previously acquired signal evolutions and/or simulated signal evolutions. Additionally, a dictionary or other reference store may include information that is a function of a signal evolution. For example, two signal evolutions may be combined into a different piece of information. Similarly, a single signal evolution may be transformed into a different piece of information. Both signal evolutions and information derived from, computed from, or that is otherwise a function of a signal evolution, may be stored. Additionally, in one embodiment, a dictionary or other reference store may include information that did not start as a signal evolution or that is not derived from a signal evolution. A dictionary may store signal evolutions associated with normal tissue, abnormal tissue, pathology, tumor, lesion, or other tissues. MR parameters associated with dictionary entries may be stored in the dictionary or stored elsewhere.

Using pattern matching to compare acquired signal evolutions to known signal evolutions may include analyzing a cross-correlation between signal evolutions of different tissues acquired using sequence blocks having different parameters. Ideally, a signal evolution would fit to exactly one member of the multi-dimensional set of known evolutions. However, a signal evolution may have relationships with more than one reference signal. Thus, in one embodiment, comparing a signal evolution to a reference signal may result in an identification of a reference signal with which the signal evolution is related and a measurement characterizing the relationship. For example, a signal evolution may be identified as matching a reference signal to within a desired tolerance. Similarly, a signal evolution may be identified as being x % likely to match a reference signal. In another embodiment, a signal evolution may be identified as being a weighted sum of a number of reference signals. One dimension of the multi-dimensional set could, for example, be associated with a first set of acquisition and/or excitation parameters while a second dimension of the multi-dimensional set could, for example, be associated with a second set of excitation and/or acquisition parameters.

FIG. 1 illustrates a volume 100 (e.g., voxel) that contains two resonant species RS1 and RS2. RS1 and RS2 may have different properties (e.g., relaxation parameters, non-relaxation parameters). For example, $T1_{RS1}$ may be less than $T1_{RS2}$ while $T2_{RS1}$ may be greater than $T2_{RS2}$. In another example, a spin density for RS1 may differ from a spin density for RS2. Conventional MR systems may acquire a T1 weighted data set in a first acquisition and then acquire a T2 weighted data set in a second acquisition and then register the data sets. MRF systems apply RF energy in a series of varied sequence blocks that cause volume 100 to simultaneously produce different NMR signals from both RS1 and RS2. A signal evolution can be produced from these simultaneously produced different NMR signals. Information including relaxation parameters (e.g., T1, T2), and non-relaxation parameters (e.g., ADC, diffusion coefficient, spin density, proton density, magnetic field strength) can be determined from the signal evolution by comparing the acquired signal to reference information. In one embodiment, the comparing may include pattern matching to other signal evolutions for which relaxation parameters are known. The resonant species RS1 and RS2 can then be characterized. Since different tissues have different known properties (e.g., relaxation parameters, non-relaxation parameters), different tissues can be identified using the characterization. While two resonant species are illustrated, a volume may include a greater or lesser number of resonant species.

Figure 2:
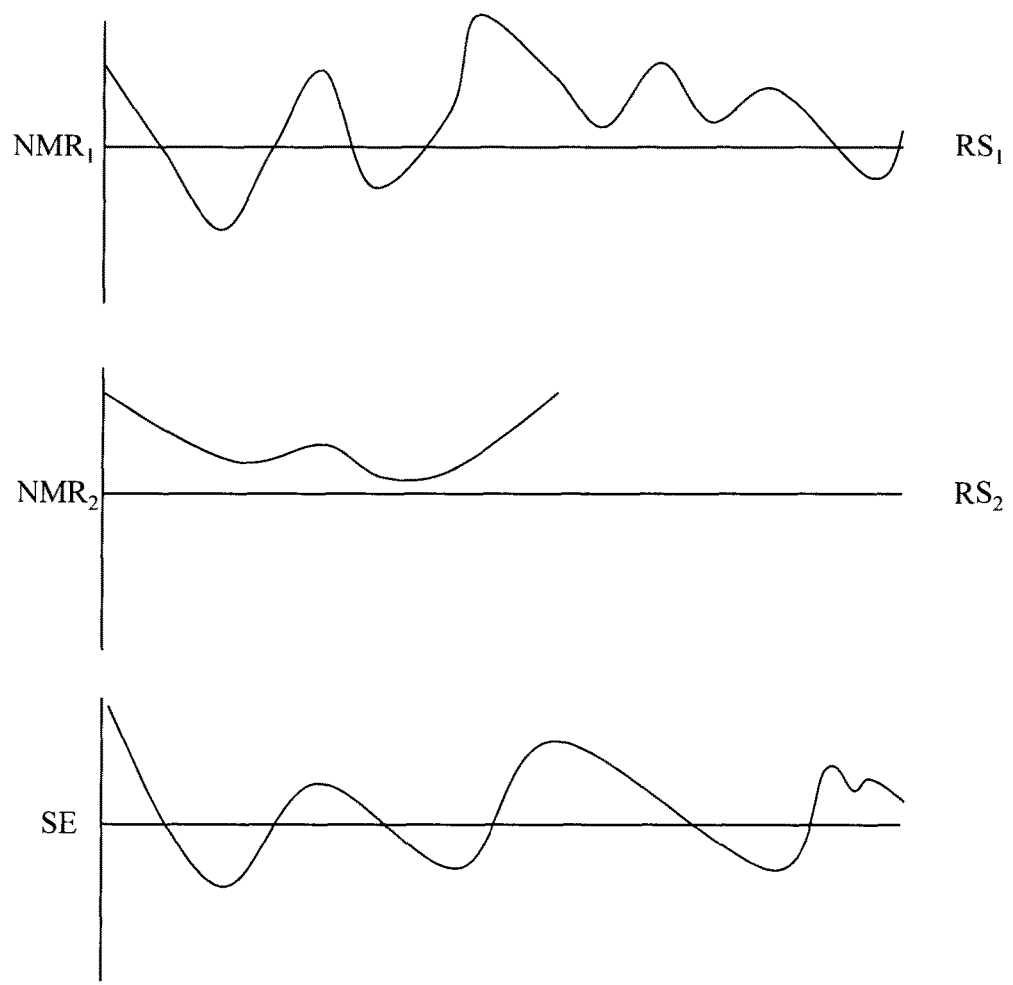
FIG. 2 illustrates two individual NMR signals received from two resonant species and a signal evolution derived from the two individual NMR signals.

FIG. 2 illustrates plots of two individual NMR signals $NMR_1$ and $NMR_2$ received from the two resonant species RS1 and RS2 in volume 100. $NMR_1$ includes data points generated by RS1 under different conditions at different times. $NMR_2$ includes data points generated by RS2 under the different conditions at the different times. Signal evolution SE results from $NMR_1$ and $NMR_2$ being generated and acquired simultaneously. The space from which the data points for $NMR_1$ and $NMR_2$ is acquired may be referred to as a (k, t, E) space, where in different examples, E refers to (T1, T2, D), (T1, T2, D, . . . ), (T1, T2, . . . ) where D refers to diffusion relaxation. In one example, both t and E may be non-linear. In another example, both t and E may be pseudo-random. Once again, while two plots associated with two resonant species are illustrated, a volume may include a greater or lesser number of resonant species and thus may produce a greater or lesser number of signals.

Figure 3:
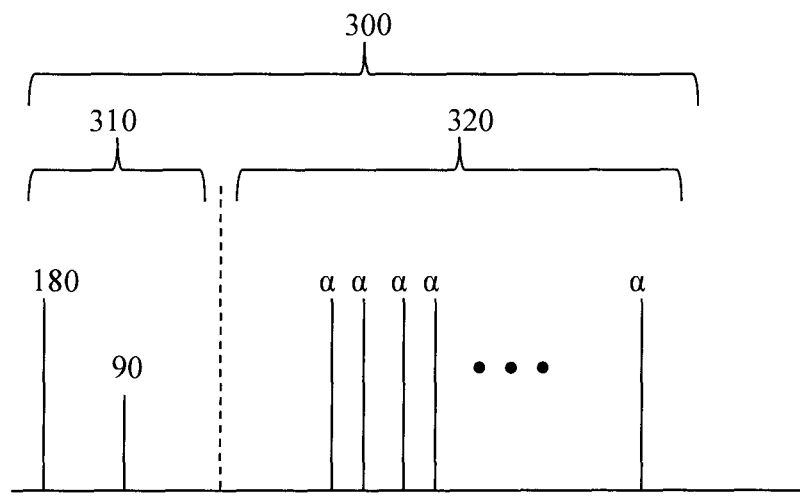
FIG. 3 compares and contrasts conventional sequence blocks to example sequence blocks.
Figure 3:
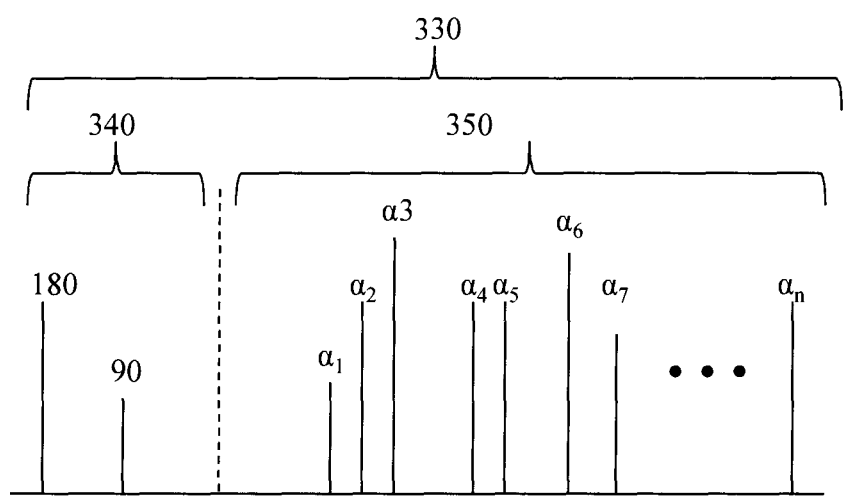

FIG. 3 compares and contrasts conventional MR sequence blocks to MRF sequence blocks. Sequence block 300 includes a preparation phase 310 and an acquisition phase 320. During acquisition phase 320, multiple acquisitions using the same flip angle and the same interval between acquisitions may be performed. Sequence block 330 also includes a phase 340 and an acquisition phase 350. Notice that acquisition phase 350 is much longer than acquisition phase 320. Unlike acquisition phase 320 where parameters are either fixed or vary linearly, in acquisition phase 350 the parameters may vary widely, either non-linearly, randomly, and/or pseudo-randomly. Parameters that may vary include, but are not limited to, echo time, flip angle, phase encoding, and others. Note also that while phase 340 may, in some examples, be a preparation phase or preparation-like phase, phase 340 does not necessarily perform a conventional preparation.

Figure 4:
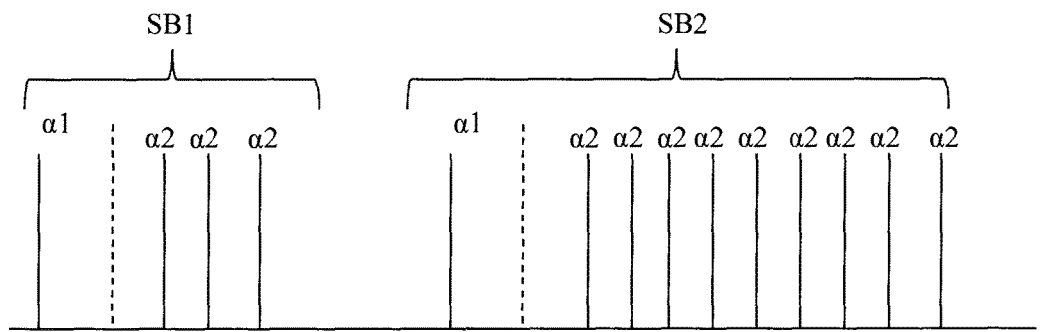
FIG. 4 illustrates an example set of sequence blocks.

FIG. 4 illustrates another example set of sequence blocks. A first sequence block SB1 has a first alpha pulse α1 and a series of identical α2 pulses. A second sequence block SB2 has the same first alpha pulse α1 and a different series of identical α2 pulses. The phase may be the same for the α2 pulses. In this example, the only difference between members of the set of sequence blocks is the number of α2 pulses.

Figure 9:
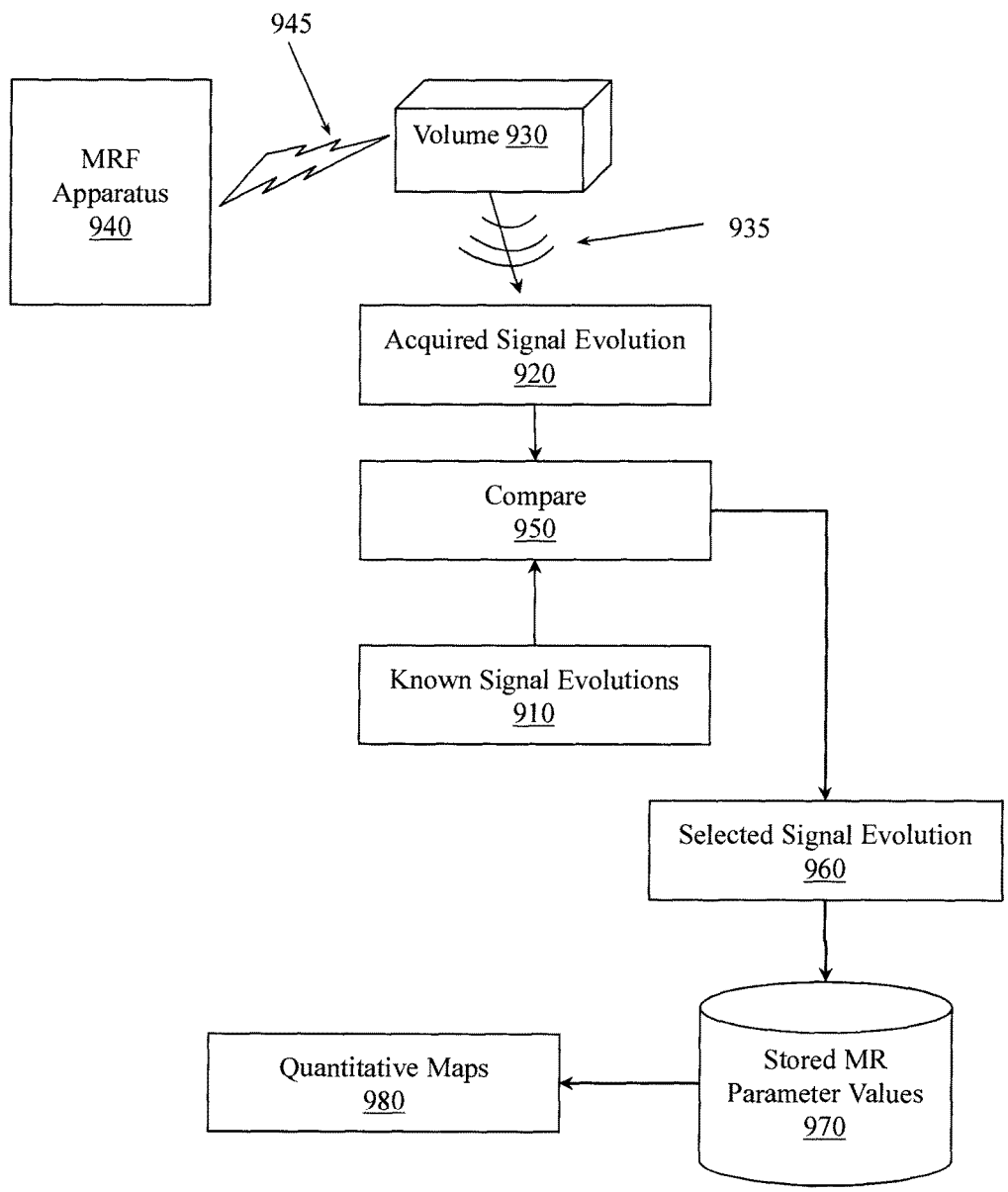
FIG. 9 illustrates production of quantitative maps using a diffusion weighted double echo (DWDE) MRF based approach.

FIG. 9 illustrates production of quantitative maps 980 using a diffusion weighted double echo (DWDE) MRF based approach. A set of known signal evolutions 910 are accessed. An NMR signal 935 is acquired from a volume 930 that contains one or more resonant species. The resonant species simultaneously produced individual NMR signals in response to magnetic resonance fingerprinting (MRF) excitation 945 produced by an MRF apparatus 940. The MRF excitation 945 employed a diffusion-weighted double-echo (DWDE) pulse sequence. The acquired NMR signal 935 includes a free induction decay (FID) signal and a spin echo signal.

An acquired signal evolution 920 is determined from the acquired NMR signal. A compare logic 950 compares the acquired signal evolution 920 to the known signal evolutions 910 to find a selected entry 960 in the set of known signal evolutions 910 that matches the acquired signal evolution. Once the selected entry 960 is found, stored MR parameters 970 associated with the selected entry 960 may be retrieved. The MR parameters may include quantitative values for T1 relaxation associated with the resonant species, T2 relaxation associated with the resonant species, an apparent diffusion coefficient (ADC) associated with the resonant species, and a proton density associated with the resonant species. Quantitative maps associated with T1 relaxation associated with the resonant species, T2 relaxation associated with the resonant species, an apparent diffusion coefficient (ADC) associated with the resonant species, and a proton density associated with the resonant species may then be produced from the stored MR parameter values 970 associated with the selected signal evolution 960.

Figure 10:
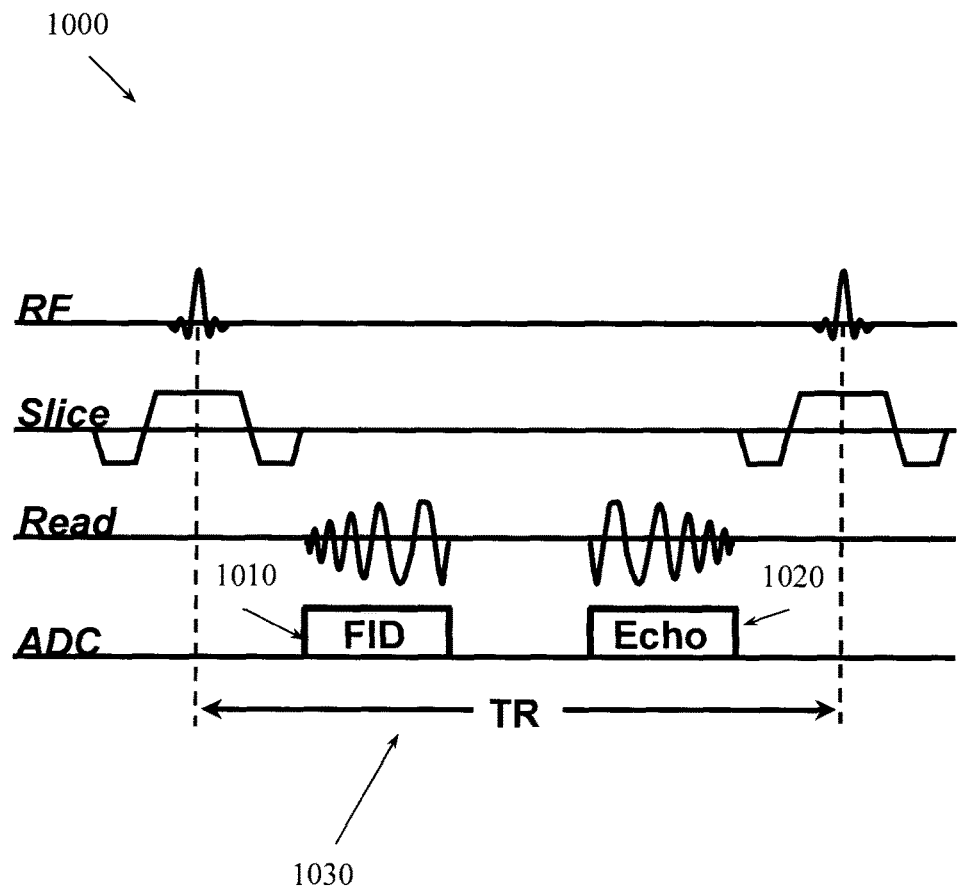
FIG. 10 illustrates an example DWDE pulse sequence.

FIG. 10 illustrates an example diffusion-weighted double-echo (DWDE) pulse sequence 1000. A free-induction decay (FID) 1010 and an echo signal 1020 are produced within one repetition time (TR) 1030. The FID 1010 may be acquired with a variable density spiral-out trajectory. The echo signal 1020 may be acquired with a variable density spiral-in trajectory. The FID signal 1010 may be more $T_1$-weighted, and the echo signal 1020 may be more $T_2$-weighted.

Figure 11:
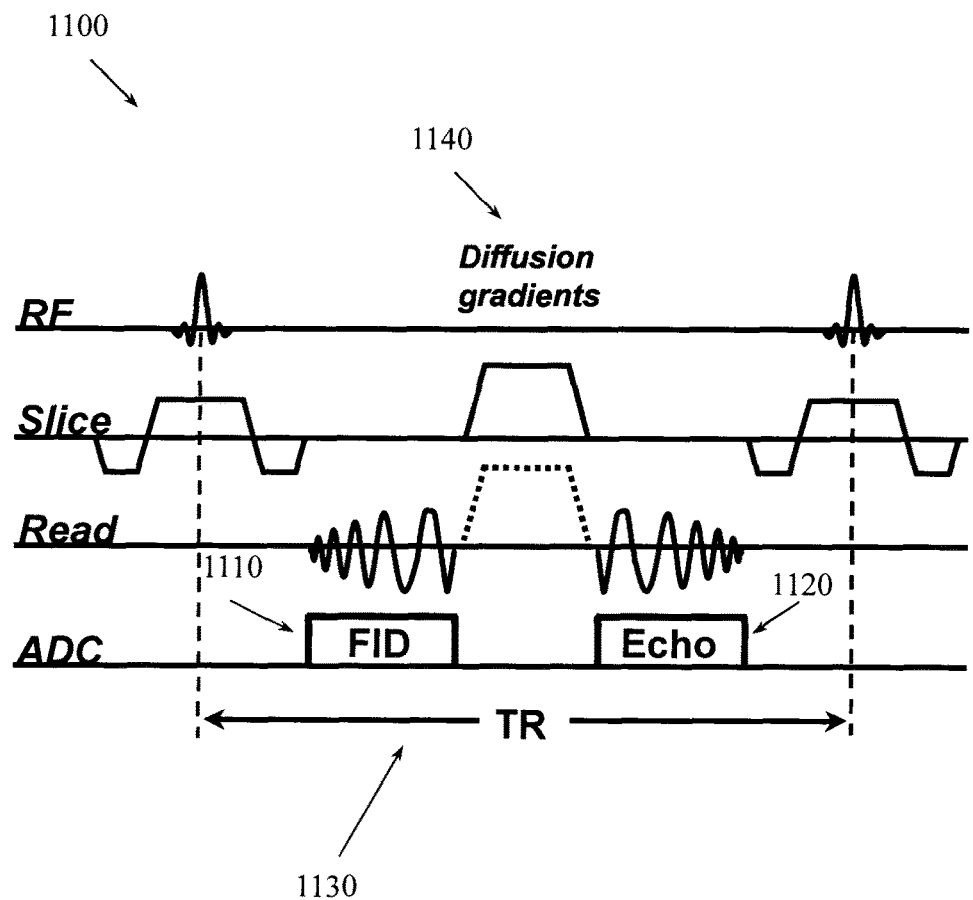
FIG. 11 illustrates an example DWDE pulse sequence.

FIG. 11 illustrates another example DWDE pulse sequence 1100. An echo signal 1120 may be made additionally sensitive to diffusion when diffusion gradients 1140 are applied. In order to increase the diffusion sensitivity of the sequence, in one embodiment a mono-polar diffusion gradient 1140 can be inserted between the FID signal 1110 and the echo signal 1120. The mono-polar diffusion gradient 1140 can be varied to produce different conditions for NMR.

Figure 12:
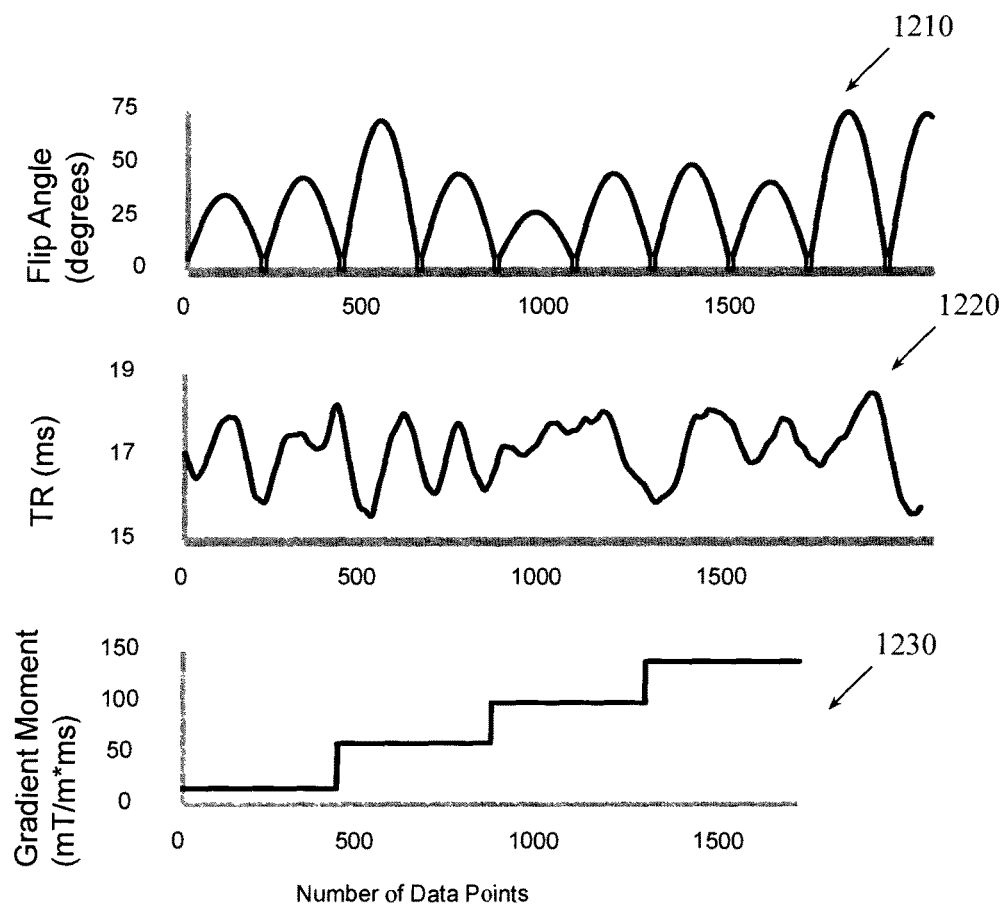
FIG. 12 illustrates various flip angles, repetition times, and gradient moments used with an example DWDE pulse sequence having a spiral readout.

FIG. 12 illustrates flip angles, repetition times, and gradient moments that may be varied when an example MRF system uses an example DWDE pulse sequence. Plot 1210 illustrates different flip angles (e.g., 0-75°) that may be used, plot 1220 illustrates different repetition times (e.g., 15.5~18.5 ms) that may be used, and plot 1230 illustrates different gradient moments (e.g., 16~140 mT/m*ms) that may be used. Different flip angles, repetition times, and gradient moments that are greater or less than the illustrated flip angles, repetition times, and gradient moments may be employed in different examples.

Figure 13:
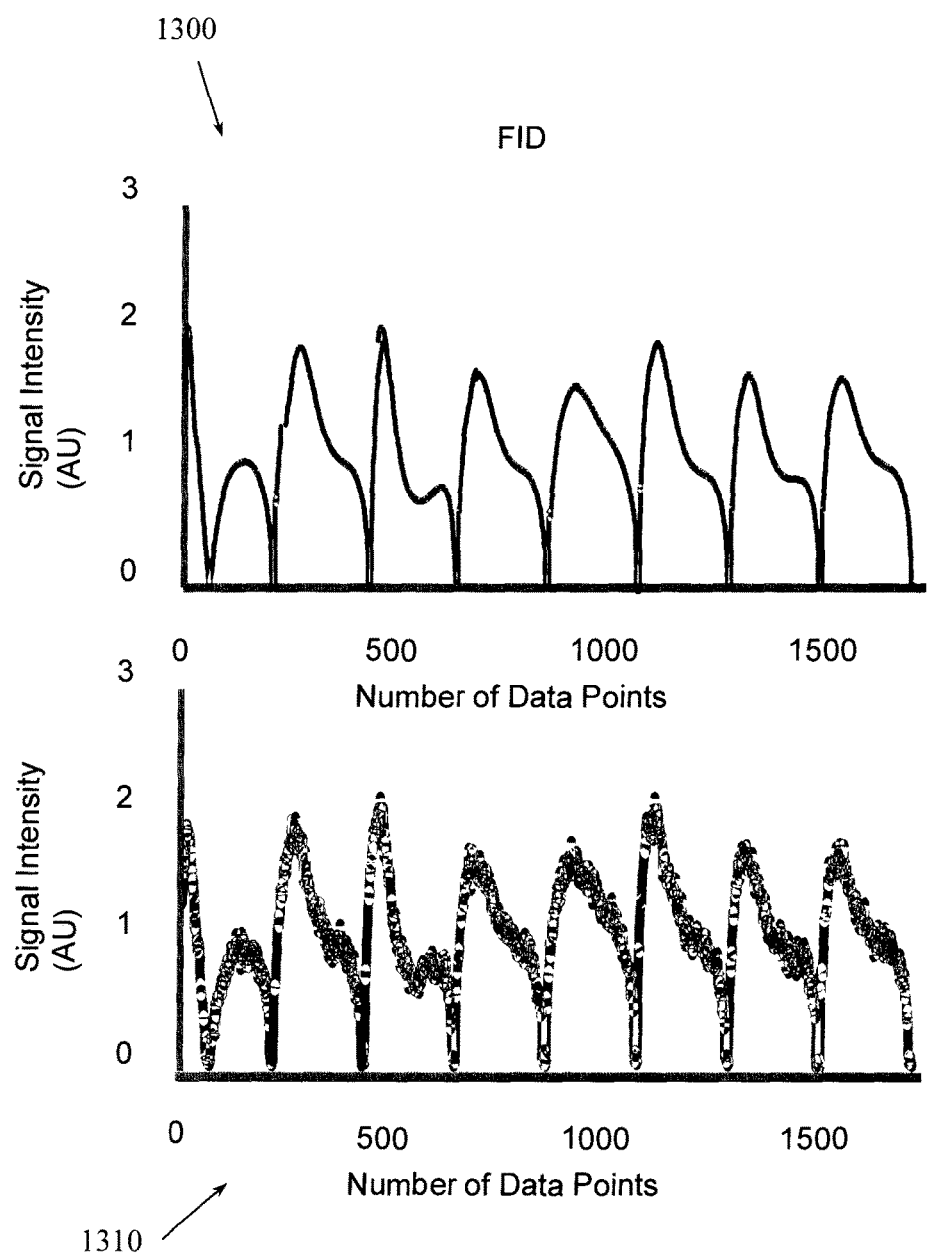
FIG. 13 illustrates a free induction decay (FID) signal matched to a dictionary entry.
Figure 14:
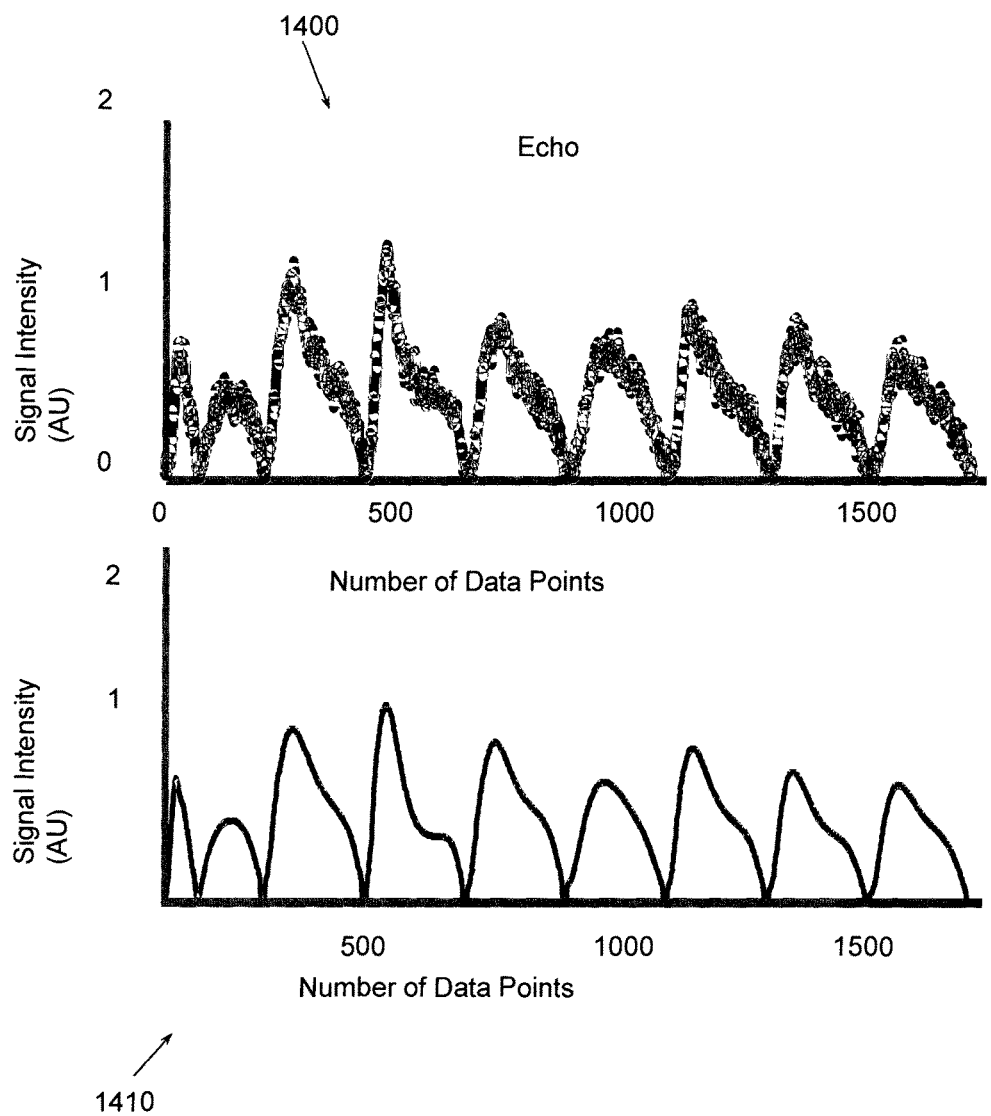
FIG. 14 illustrates an echo signal matched to a dictionary entry.

FIGS. 13 and 14 illustrate FID signal evolutions and echo signal evolutions produced by an MRF-DWDE process using the flip angles, repetition times, and gradient moments illustrated in FIG. 12. FIG. 13 illustrates a stored signal evolution 1300 and an observed FID signal evolution 1310. There is a close correlation between the stored signal evolution 1300 and the observed signal evolution 1310. MRF may match the FID signal evolution 1310 to a stored FID signal evolution to identify the material that produced the FID signal evolution 1310. FIG. 13 shows the signal time course of the FID from one pixel of acquired signal and its matched dictionary entry. FIG. 14 shows the signal time course of the spin echo from one pixel of acquired signal and its matched dictionary entry. FIG. 14 illustrates a stored signal evolution 1410 and an observed echo signal evolution 1400. There is a close correlation between the stored signal evolution 1410 and the observed echo signal evolution 1400. MRF may match the stored signal evolution 1410 to the observed signal evolution 1400 to identify the material that produce the spin echo evolution 1400.

Example apparatus and methods were evaluated on a phantom of five cylindrical tubes constructed with varying concentrations of agarose, Gd-DPTA, and sucrose to yield compartments with different T1, T2 and ADC values. Evaluations were performed on a Siemens Magnetom Skyra 3T (Siemens AG Medical Solutions, Erlangen, Germany) with a twelve channel head receiver array. T1 and T2 values were measured by the balanced-SSFP MRF method, which is not sensitive to diffusion. Spin-echo, diffusion-weighted EPI sequences (b=0, 500, 1000 and 1500 s/mm$^2$ with TE of 86 ms) were used to quantify ADC values.

Figure 15:
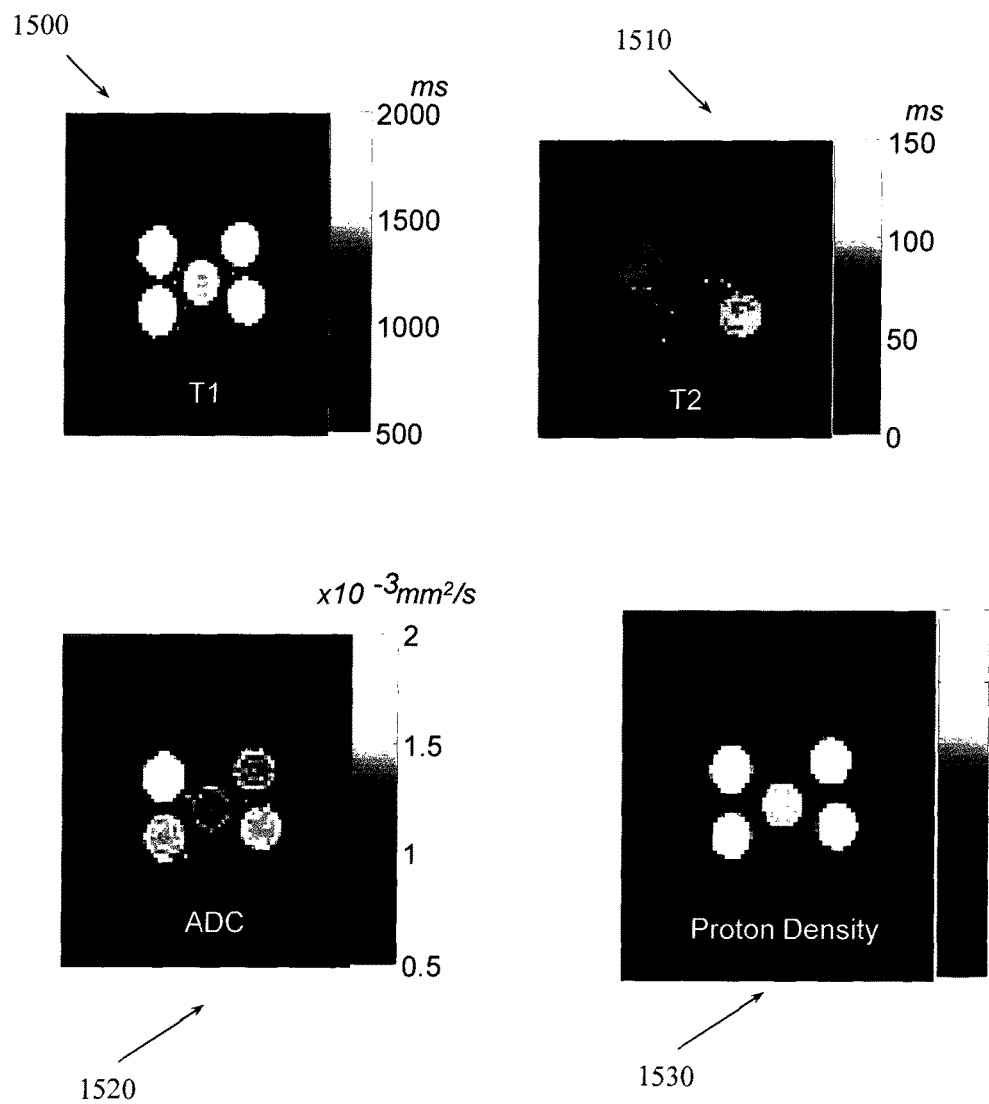
FIG. 15 illustrates T1, T2, ADC, and proton density maps generated from an example DWDE MRF acquisition.
Figure 16:
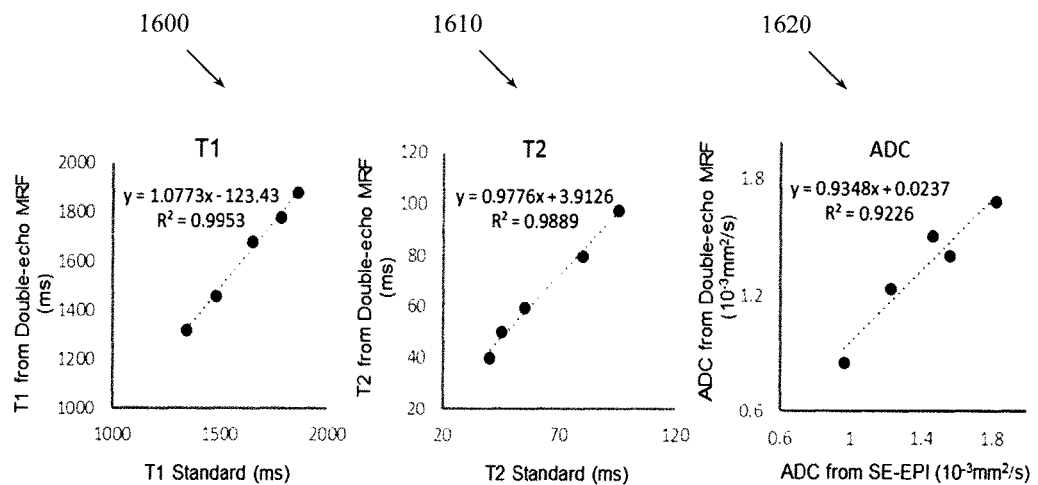
FIG. 16 illustrates T1, T2, and ADC values.

FIG. 15 shows the reconstructed T1, T2, ADC and M0 maps from a DWDE MRF evaluation. FIG. 16 shows the comparison of T1, T2, and ADC associated with the reconstructed images in FIG. 15 to corresponding standards. These results indicate that the example DWDE MRF approach quantifies the relaxation parameters together with diffusion within the MRF framework. The DWDE MRF sequence generates different signal evolutions that can be employed to quantify these parameters simultaneously. Example methods and apparatus are also sensitive to macroscopic motion.

Figure 17:
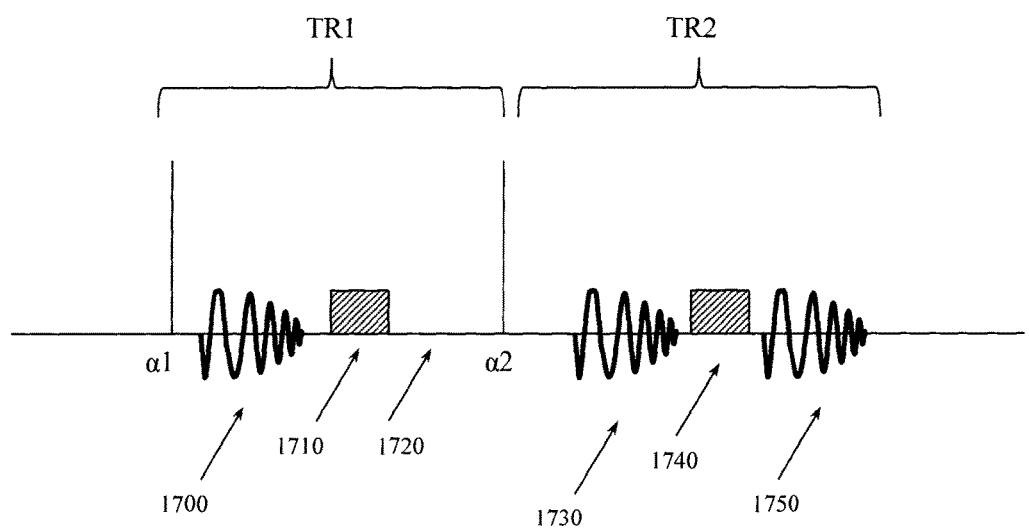
FIG. 17 illustrates a diffusion pulse sequence.

In one embodiment, both an FID signal and an echo signal may be acquired in a single repetition. FIG. 17 illustrates example signals associated with an example MRF DWDE pulse sequence. In a first repetition time TR1, after a first alpha pulse α1, there is an FID signal 1700 and a gradient 1710 but there is no spin echo in region 1720. In a second repetition time TR2, after a second alpha pulse α2, there is an FID signal 1730 and a gradient 1740 and a spin echo 1750. There is no spin echo in region 1720 because it is cancelled by gradient 1720. Gradient 1740 rewinds magnetization and thus the spin echo is produced at 1750. The FIDs 1700 and 1730 are primarily T1 weighted and the spin echo 1750 is primarily T2 weighted. The FID 1700 is primarily due to the first alpha pulse α1.

In one embodiment, the DWDE pulse sequence may use spiral trajectories to acquire signals. In one embodiment, spiral trajectories for both FID acquisition and echo acquisition use six interleaves to sample an inner 10×10 region. In one embodiment, the spiral trajectories for both FID acquisition and echo acquisition may use 48 interleaves to sample an outer 128×128 region of k-space. Under-sampled DWDE MRF data may be acquired using, for example, six spiral interleaves. An example dictionary of signal evolutions with a range of T1 (50-3000 ms), T2 (10-300 ms) and ADC $((0-3)*10^{-3}$ mm$^2$/s) may be simulated using an extended phase graph approach. An example extended phase graph approach is described in Weigel M et al. *J. Magn. Reson.* 2010; 205(2):276-85. 4. Lavdas I et al. *J. Magn. Reson. Imaging.* 2013; 38(1):173-9. Example apparatus and methods may use a template-matching approach to match obtained signal evolutions to closest dictionary entries. When a dictionary entry is selected, the corresponding T1, T2, proton density, and ADC values may be retrieved.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable storage medium", as used herein, refers to a non-transitory medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 5:
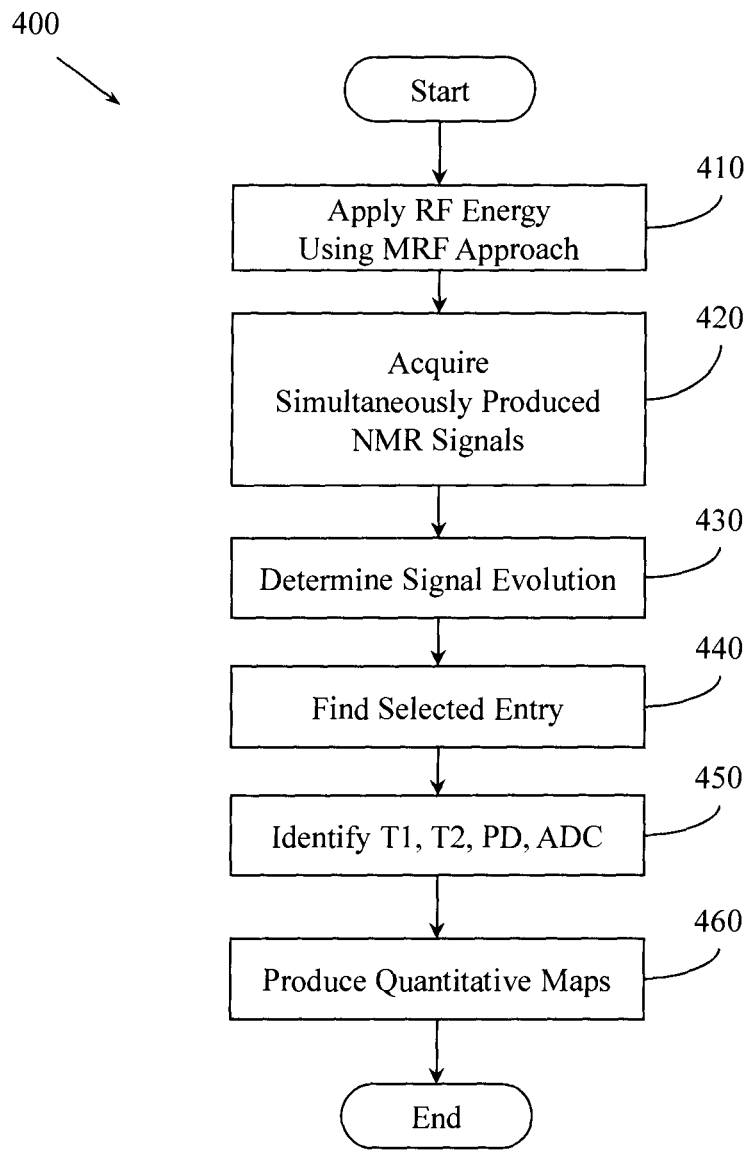
FIG. 5 illustrates an example method associated with diffusion weighted double-echo MRF.

FIG. 5 illustrates a method 400 associated with DWDE MRF. Method 400 includes, at 410, controlling an NMR apparatus to apply RF energy to a volume in an object. The volume may contain one or more resonant species. In one embodiment, the object may be a human and thus resonant species may include, but are not limited to, tissue, tumors, fat, water, hydrogen, and metal and plastics of prosthetics or other orthopedic hardware. The RF energy may be applied in a series of variable sequence blocks. In one embodiment, the RF energy is applied according to an MRF excitation that employs a DWDE pulse sequence that will produce and acquire a free induction decay (FID) signal and a spin echo signal. In one embodiment, the NMR apparatus may be controlled at 410 to apply members of the series of variable sequence blocks according to a partially random acquisition plan that under-samples the object at an under-sampling rate R. In different embodiments, the rate R may be, for example, two, four, or greater.

Sequence blocks may vary in a number of parameters including, but not limited to, echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling. In different embodiments two, three, four, or more parameters may vary between sequence blocks. In different embodiments, the number of parameters varied between sequence blocks may itself vary. For example, A1 (sequence block 1) may differ from A2 in five parameters, A2 may differ from A3 in seven parameters, and A3 may differ from A4 in two parameters. There are a nearly infinite number of series of sequence blocks that can be created by varying this large number of parameters. In one embodiment, a series of sequence blocks is crafted so that the series have different amounts (e.g., 1%, 2%, 5%, 10%, 50%, 99%, 100%) of unique sequence blocks as defined by their varied parameters. In different embodiments, a series of sequence blocks may include more than ten, more than one hundred, more than one thousand, more than ten thousand, and more than one hundred thousand sequence blocks. In one example, the difference between consecutive sequence blocks may be the number of α2 pulses as illustrated in FIG. 4.

The RF energy applied during a sequence block causes different individual resonant species to simultaneously produce individual NMR signals. Unlike conventional MR systems, at least one member of the series of variable sequence blocks will differ from at least one other member of the series of variable sequence blocks in at least N sequence block parameters, N being an integer greater than one. The signal content of a signal evolution may vary directly with N. Thus, as more parameters are varied, a potentially richer signal is retrieved. Richer signals may be compared to signals in a dictionary to identify MR parameters.

Method 400 also includes, at 420, controlling the NMR apparatus to acquire the simultaneously produced individual NMR signals. The acquired NMR signals may include an FID signal and a spin echo signal. In one embodiment, the DWDE pulse sequence includes a variable density spiral out readout to acquire the FID signal. In one embodiment, the DWDE pulse sequence uses a variable density spiral in readout to acquire the spin echo signal. The FID signal is primarily T1 weighted and the spin echo signal is primarily T2 weighted. Being primarily T1 weighted means the FID signal encodes more information associated with T1 than with T2. Being primarily T2 weighted means the spin echo signal encodes more information associated with T2 than T1.

The DWDE pulse sequence is not a diffusion weighted steady state free precession (DW-SSFP) pulse sequence. In one embodiment, the MRF DWDE pulse sequence may include a diffusion gradient between the FID signal and the spin echo signal. Applying the diffusion gradient between the FID signal and the spin echo signal may cause the spin echo signal to be more sensitive to diffusion than when the diffusion gradient is not applied. The diffusion gradient may be, for example, a mono-polar diffusion gradient.

Method 400 also includes, at 430, controlling the NMR apparatus to determine a signal evolution from the acquired NMR signals. Determining the signal evolution may include storing (k, t, E) space data points acquired during action 420. While an individual sequence block may yield a single point in (k, t, E) space, the signal evolution is determined by the series of variable sequence blocks. In one embodiment, the simultaneously produced signals are acquired at 420 over a first period of time and the signal evolution is determined at 430 over a second period of time. In different embodiments the first period of time may be ten seconds or longer, sixty seconds or longer, or even longer. Additionally, in different embodiments, the second period of time may be ten seconds or longer, sixty seconds or longer, or even longer.

Method 400 also includes, at 440, comparing first information (e.g., observed signal evolution) to reference information (e.g., MRF dictionary entries) to find a selected entry in the reference information. Comparing the first information may include pattern matching or other processes that determine how similar the first information is to the reference information. The reference information may include signal evolutions associated with healthy tissue, normal tissue, abnormal tissue, diseased tissue, tumors, lesions, or other pathology. The first information may be, for example, the signal evolution. The reference information may be, for example, known, stored, simulated, and/or predicted signal evolutions. The reference information may also include information that is produced as a function of a known, stored, simulated, or predicted signal evolution. The reference information may be produced by, for example, transforming a signal evolution, combining signal evolutions, decomposing signal evolutions, and other operations. In different examples, the "stored" signal evolutions may include previously acquired signals, simulated signals, or both. In one embodiment, the stored signal evolutions are associated with signals not acquired from the object while in another embodiment the stored signal evolutions are associated with signals acquired from the object. In one embodiment, the stored signals may be associated with signals acquired from the object being analyzed and signals not acquired from the object being analyzed.

The stored signals and information derived from reference signal evolutions may be associated with a potentially very large data space. The data space for signal evolutions can be partially described by:

$$SE = \sum_{S=1}^{N_S} \prod_{A=1}^{N_A} \sum_{j=1}^{N_{RF}} R_{i(\alpha)} R_{RF_{ij}(\alpha,\phi)} R(G) E(T1, T1, K\,) DPdM_0$$

where:
SE is a signal evolution,
$N_S$ is a number of spins,
$N_A$ is a number of sequence blocks,
$N_{RF}$ is a number of RF pulses in a sequence block,
α is a flip angle,
φ is a phase angle,
Ri(α) is a rotation due to off resonance,
$R_{RFij}(α,φ)$ is a rotation due to RF differences,
R(G) is a rotation due to a gradient,
T1 is spin-lattice relaxation,
T2 is spin-spin relaxation,
D is diffusion relaxation,
Pd is proton density,
$E_i(T1, T2, \ldots )$ is associated with magnetization changes, and
$M_0$ is the default or natural alignment to which spins align when placed in the main magnetic field.

Additionally or alternatively, the summation on j could be replaced by a product on j, e.g.:

$$SE = \sum_{S=1}^{N_S} \prod_{A=1}^{N_A} \sum_{j=1}^{N_{RF}} R_{i(\alpha)} R_{RF_{ij}(\alpha,\phi)} R(G) E(T1, T1, K\ ) DP dM_0$$

In one embodiment, the dictionary may store signals described by:

$$S_i = R_i E_i(S_{i-1}),$$

where:
$S_0$ is the default or equilibrium magnetization,
$S_i$ is a vector that represents the different components of magnetization Mx, My, Mz during acquisition block i,
$R_i$ is a combination of rotational effects that occur during acquisition block i, and
$E_i$ is a combination of effects that alter the amount of magnetization in the different states for acquisition block i. In this embodiment, the signal at acquisition block i is a function of the previous signal at acquisition block i−1. Additionally or alternatively, the dictionary may store signals described by:

$$S_i = R_i E_i \sum_{x=1}^{i-1} R_x E_x(S_x)$$

or $$S_i = R_i E_i \Pi_{x=1}^{i-1} R_x E_x(S_x).$$

In this embodiment, the signal is a function of the current relaxation and rotation effects and of previous acquisitions. Additionally or alternatively, the dictionary may store signals described by:

$$S_i = \sum_{s=1}^{N_s} R_{s,i} E_{s,i}(S_{s,i-1}).$$

In this embodiment, voxels have multiple resonant species or spins, and the effects may be different for every spin within a voxel. Additionally or alternatively, the dictionary may store signals described by:

$$S_i = \sum_{s=1}^{N_s} R_{s,i} E_{s,i} \sum_{x=1}^{i-1} R_{s,x} E_{s,x}(S_{s,x})$$

or $$S_i = \sum_{s=1}^{N_s} R_{s,i} E_{s,i} \Pi_{x=1}^{i-1} R_{s,x} E_{s,x}(S_{s,x})$$

In this embodiment, voxels may have multiple resonant species or spins, and the effects may be different for spins within a voxel, and thus the signal may be a function of the effects and the previous acquisition blocks.

Method 400 also includes, at 450, identifying MR parameters associated with the resonant species. Identifying MR parameters may include retrieving, from stored MR parameters associated with the selected entry, quantitative values for T1 relaxation associated with the resonant species, T2 relaxation associated with the resonant species, an apparent diffusion coefficient (ADC) associated with the resonant species, and a proton density associated with the resonant species.

Method 400 also includes, at 460, producing, from the quantitative values, quantitative maps associated with T1 relaxation associated with the resonant species, T2 relaxation associated with the resonant species, an apparent diffusion coefficient (ADC) associated with the resonant species, and a proton density associated with the resonant species. In one embodiment the quantitative maps may be produced simultaneously (e.g., in parallel).

While FIG. 5 illustrates various actions occurring in serial, it is to be appreciated that various actions illustrated in FIG. 5 could occur substantially in parallel. By way of illustration, a first process could control applying RF energy, a second process could control acquiring NMR signals and determining a signal evolution, a third process could perform comparisons, and a fourth process could identify an apparent diffusion coefficient simultaneously with T1, T2, and proton density. While four processes are described, it is to be appreciated that a greater and/or lesser number of processes could be employed.

Figure 6:
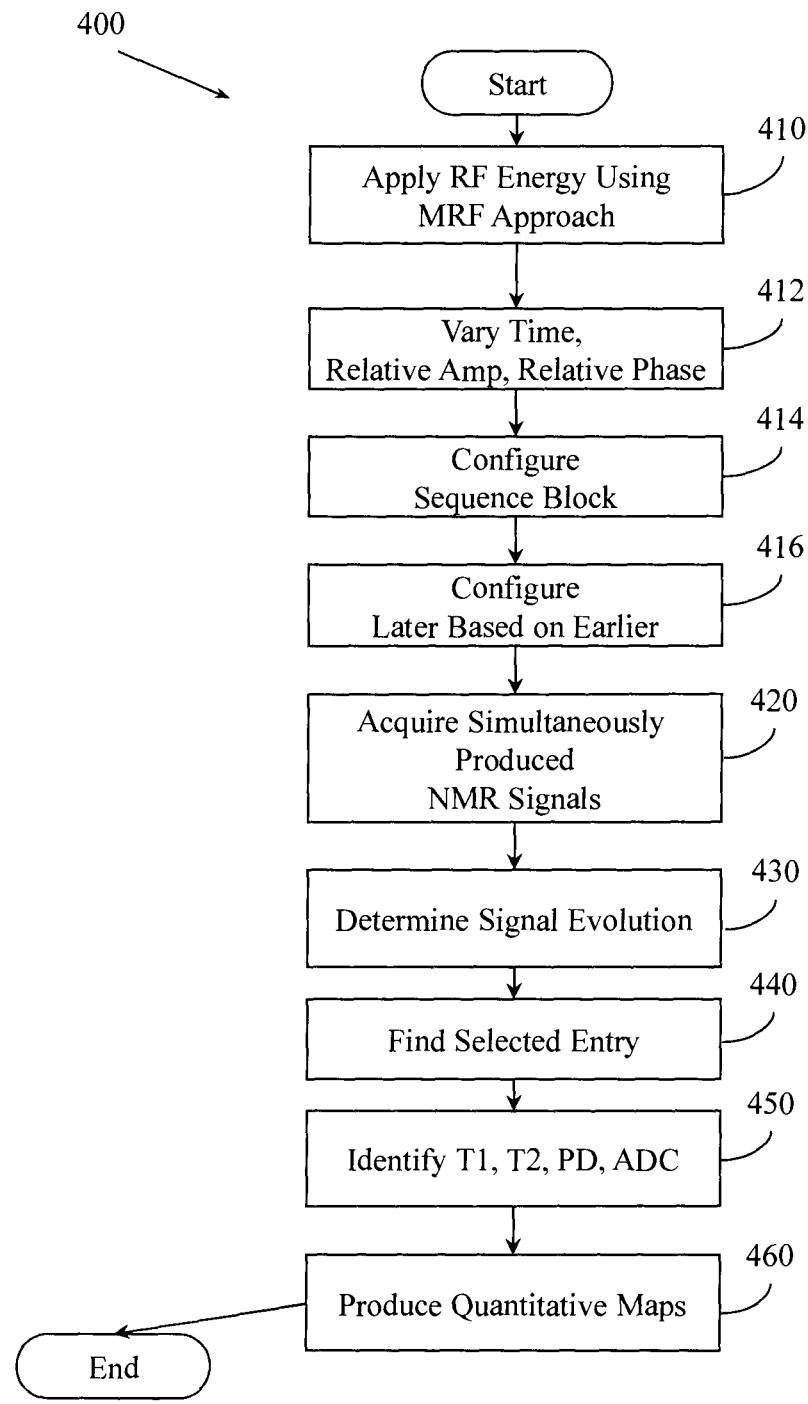
FIG. 6 illustrates an example method associated with diffusion weighted double-echo MRF.

FIG. 6 illustrates another embodiment of method 400 (FIG. 5). This embodiment includes actions 410, 420, 430, 440, 450, and 460. However, this embodiment also includes actions 412, 414, and 416. This embodiment of method 400 includes, at 412, controlling the NMR apparatus to vary one or more of, the amount of time between sequence blocks, the relative amplitude of sequence blocks, and the relative phase of sequence blocks. Thus, not only can the individual parameters (e.g., flip angle, repetition time, gradient strength, phase) be varied between sequence blocks, but the times between sequence blocks and other differences between sequence blocks can be varied. This facilitates creating additional signal content in the signal evolution. Additional signal content in the signal evolution may produce a more complicated signal evolution to be compared against the dictionary.

This embodiment of method 400 also includes, at 414, controlling the NMR apparatus to reconfigure a member of the series of variable sequence blocks with respect to, for example, a diffusion gradient applied between RF pulses or a diffusion gradient applied between acquiring an FID and acquiring a spin echo. Action 414 illustrates that a set of MRF sequence blocks is not necessarily the same thing as a conventional MR pulse sequence. An MRF sequence block differs from a conventional pulse sequence for at least the reason that non-linearly varying Δt and ΔE, which produce NMR signals in (k, t, E) space having non-constant amplitudes and phases are encouraged, not prohibited.

This embodiment of method 400 also includes, at 416, controlling the NMR apparatus to configure a later member of the series of variable sequence blocks based, at least in part, on an NMR signal acquired in response to applying an earlier member of the series of variable sequence blocks. Thus, this embodiment of method 400 is an adaptive method where the order of members of the series of varied sequence blocks may not be known ahead of time. Instead, as data points in (k, t, E) space are acquired, and as a signal evolves, decisions concerning different sequence blocks and different sets of parameters to vary may be made. By way of illustration, a first number of data points in (k, t, E) space and an evolving signal may be leading towards one relaxation parameter determination and away from another relaxation parameter determination. Therefore, sequence blocks that can confirm and/or reject either of these leads may be applied next in the series to facilitate a guided and more rapid convergence in the pattern matching process.

Figure 7:
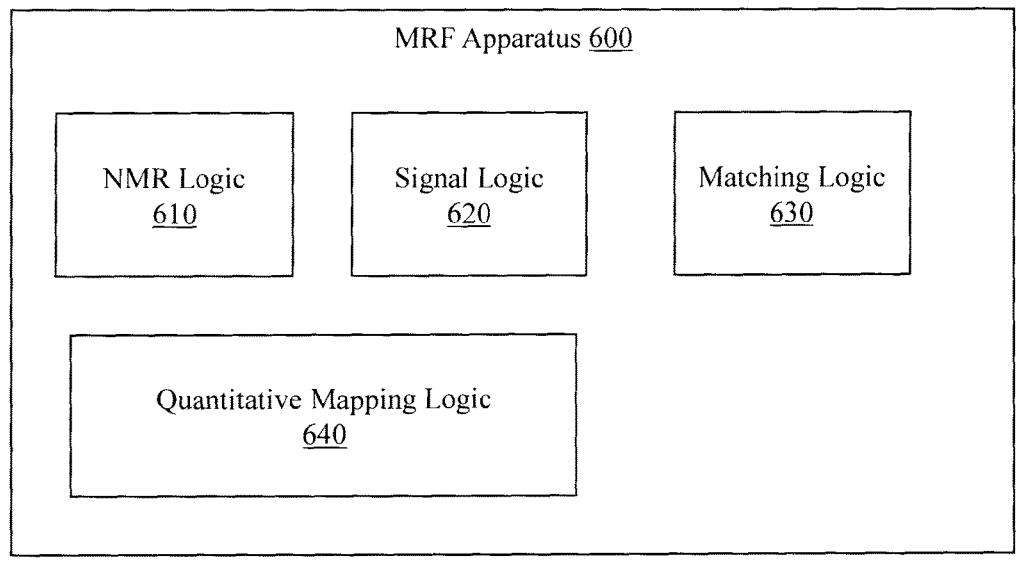
FIG. 7 illustrates an example apparatus associated with diffusion weighted double-echo MRF.

FIG. 7 illustrates an MRF apparatus 600. MRF apparatus 600 simultaneously quantifies MR parameters including T1, T2, proton density, and the apparent diffusion coefficient (ADC) for an object to which an MRF DWDE pulse sequence is applied. In one embodiment, MRF apparatus 600 provides an MR image that facilitates identifying certain tissues based on their relative hypo-intense or hyper-intense appearance on an MR image (e.g., T1 weighted image, T2 weighted image).

MRF apparatus 600 includes an NMR logic 610. NMR logic 610 repetitively and variably samples an object in a (k, t, E) space to acquire a set of NMR signals that may have non-constant amplitude and/or phase. Members of the set of NMR signals are associated with different points in the (k, t, E) space. In different embodiments the different points are sampled according to a plan where t and/or E varies non-linearly and/or in a non-constant manner. NMR logic 610 may sample the object using a diffusion-weighted double-echo pulse sequence. In one embodiment, a spiral readout may be employed. The DWDE pulse sequence may produce two signals per repetition time (TR). For example, both a free induction decay (FID) signal and an echo signal may be produced per TR. In one embodiment, the FID signal may be acquired with a variable density spiral-out trajectory and the spin echo signal may be acquired with a variable density spiral-in trajectory. In one embodiment the FID signal may be more T1-weighted and the echo signal may be more T2-weighted. In one embodiment, a mono-polar diffusion gradient may be inserted between the FID and the spin echo. Inserting the mono-polar diffusion gradient may increase the diffusion sensitivity of the DWDE pulse sequence. In one embodiment, the FID and the spin echo may be acquired with varying flip angles, varying repetition times, and varying diffusion gradient moments.

MRF apparatus 600 also includes a signal logic 620. Signal logic 620 produces an NMR signal evolution from the acquired NMR signals. The signal evolution may include a number of NMR signals acquired over a period of time. The set of NMR signals may include transient-state signals associated with the MRF DWDE pulse sequence, a free induction decay signal, and a spin echo signal.

MRF apparatus 600 also includes a matching logic 630. Matching logic 630 compares the produced NMR signal evolution or information associated with the produced NMR signal evolution to reference information. "Match" as used herein refers to the result of comparing signals. "Match" does not refer to an exact match, which may or may not be found. A match may be the signal that most closely matches another signal. A match may be the first signal that matches another signal to within a threshold. A match may be found by template matching, pattern matching, or other comparison approaches. The reference information may be, for example, a previously acquired signal evolution, a simulated signal evolution, an item derived from a signal evolution other than the produced NMR signal evolution, and other information. The reference information may include signal evolutions from different tissue types (e.g., healthy, diseased, advanced disease).

MRF apparatus 600 also includes a quantitative mapping logic 640. Quantitative mapping logic 640 simultaneously produces quantitative maps for T1, T2, proton density, and diffusion associated with the object based, at least in part, on the stored signal evolution that matches the NMR signal evolution. The MR parameters may be retrieved from a data store that links stored MR parameters to the reference information. Quantitative mapping logic 640 may also display the quantitative maps.

While matching logic 630 and quantitative mapping logic 640 are illustrated as being part of MRF apparatus 600, in one embodiment, the matching logic 630 and quantitative mapping logic 640 may reside in an apparatus separate from the MRF apparatus 600. In this embodiment, MRF apparatus 600 may provide NMR signals to the separate apparatus housing matching logic 630 or quantitative mapping logic 640. In one embodiment, matching logic 630 or quantitative mapping logic 640 may reside in separate apparatus.

Figure 8:
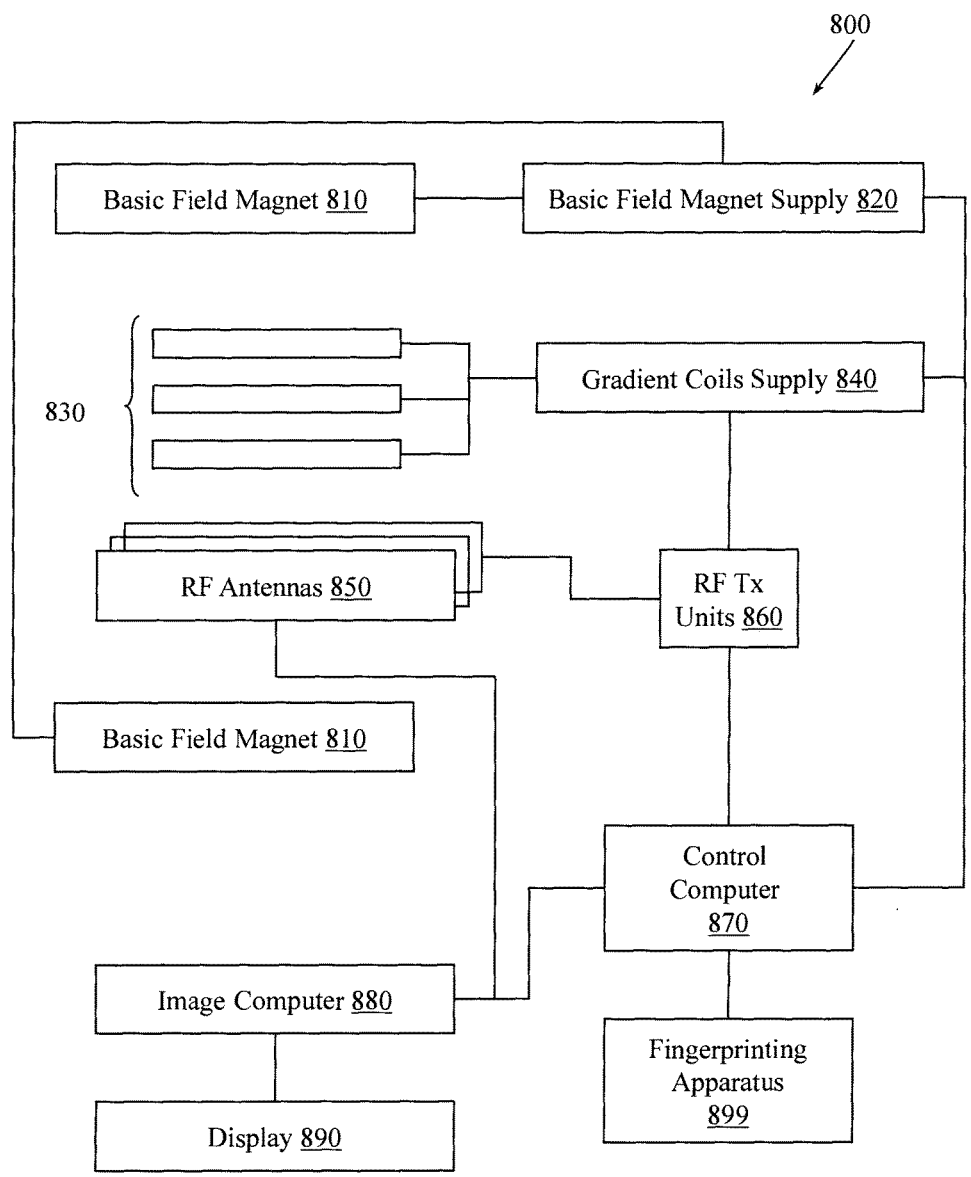
FIG. 8 illustrates an MR apparatus associated with diffusion weighted double-echo MRF.

FIG. 8 illustrates an example MR apparatus 800 configured with a fingerprinting apparatus 899 to facilitate MR fingerprinting using a DWDE pulse sequence that simultaneously quantifies T1, T2, proton density, and ADC. The fingerprinting apparatus 899 may be configured with elements of example apparatus described herein and/or may perform example methods described herein. While fingerprinting apparatus 899 is illustrated as part of MR apparatus 800, in one example, fingerprinting apparatus 899 may be a separate apparatus or apparatuses.

The apparatus 800 includes a basic field magnet(s) 810 and a basic field magnet supply 820. Ideally, the basic field magnets 810 would produce a uniform B0 field. However, in practice, the B0 field may not be uniform, and may vary over an object being analyzed by the MR apparatus 800. MR apparatus 800 may include gradient coils 830 configured to emit gradient magnetic fields like $G_S$, $G_P$ and $G_R$. The gradient coils 830 may be controlled, at least in part, by a gradient coils supply 840. In some examples, the timing, strength, and orientation of the gradient magnetic fields may be controlled, and thus selectively adapted, during an MR procedure.

MR apparatus 800 may include a set of RF antennas 850 that generate RF pulses and to receive resulting NMR signals from an object to which the RF pulses are directed. In some examples, how the pulses are generated and how the resulting MR signals are received may be controlled and thus may be selectively adapted during an MR procedure. Separate RF transmission and reception coils can be employed. The RF antennas 850 may be controlled, at least in part, by a set of RF transmission units 860. An RF transmission unit 860 may provide a signal to an RF antenna 850.

The gradient coils supply 840 and the RF transmission units 860 may be controlled, at least in part, by a control computer 870. In one example, the control computer 870 may be programmed to control an NMR device as described herein. Conventionally, the MR signals received from the RF antennas 850 can be employed to generate an image and thus may be subject to a transformation process like a two dimensional FFT that generates pixilated image data. The transformation can be performed by an image computer 880 or other similar processing device. The image data may then be shown on a display 890.

Fingerprinting apparatus 899 facilitates not having to do conventional reconstruction of an image from MR signals received from the RF antennas 850. Thus the RF energy applied to an object by apparatus 800 need not be constrained to produce signals with substantially constant amplitudes or phases. Instead, fingerprinting apparatus 899 facilitates matching received signals to known signals for which a reconstruction, relaxation parameter, or other information is already available.

While FIG. 8 illustrates an example MR apparatus 800 that includes various components connected in various ways, it is to be appreciated that other MR apparatus may include other components connected in other ways.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one of, A, B, and C" is employed herein, (e.g., a data store configured to store one of, A, B, and C) it is intended to convey the set of possibilities A, B, and C, (e.g., the data store may store only A, only B, or only C). It is not intended to require one of A, one of B, and one of C. When the applicants intend to indicate "at least one of A, at least one of B, and at least one of C", then the phrasing "at least one of A, at least one of B, and at least one of C" will be employed.

To the extent that the phrase "one or more of, A, B, and C" is employed herein, (e.g., a data store configured to store one or more of, A, B, and C) it is intended to convey the set of possibilities A, B, C, AB, AC, BC, ABC, AA . . . A, BB . . . B, CC . . . C, AA . . . ABB . . . B, AA . . . ACC . . . C, BB . . . BCC . . . C, or AA . . . ABB . . . BCC . . . C (e.g., the data store may store only A, only B, only C, A&B, A&C, B&C, A&B&C, or other combinations thereof including multiple instances of A, B, or C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A method, comprising:
   accessing a set of known signal evolutions;
   accessing an acquired nuclear magnetic resonance (NMR) signal, where the acquired NMR signal was produced by a volume that contains one or more resonant species that simultaneously produced individual NMR signals in response to magnetic resonance fingerprinting (MRF) excitation that employed a diffusion-weighted double-echo (DWDE) pulse sequence, where the acquired NMR signal includes a free induction decay (FID) signal and a spin echo signal;
   determining a signal evolution from the acquired NMR signal;
   finding a selected entry in the set of known signal evolutions that matches the signal evolution;
   retrieving, from stored MR parameters associated with the selected entry, quantitative values for T1 relaxation associated with the resonant species, T2 relaxation associated with the resonant species, an apparent diffusion coefficient (ADC) associated with the resonant species, and a proton density associated with the resonant species, T1 being spin-lattice relaxation, T2 being spin-spin relaxation, and
   simultaneously producing, from the quantitative values, quantitative maps associated with T1 relaxation associated with the resonant species, T2 relaxation associated with the resonant species, an apparent diffusion coefficient (ADC) associated with the resonant species, and a proton density associated with the resonant species.

2. The method of claim 1, where the DWDE pulse sequence performs a spiral readout.

3. The method of claim 1, where the DWDE pulse sequence performs a variable density spiral out readout to acquire the FID signal.

4. The method of claim 1, where the DWDE pulse sequence performs a variable density spiral in readout to acquire the spin echo signal.

5. The method of claim 4, where the DWDE pulse sequence is not a diffusion weighted steady state free precession (DW-SSFP) pulse sequence.

6. The method of claim 1, where the FID signal is primarily T1 weighted.

7. The method of claim 1, where the spin echo signal is primarily T2 weighted.

8. The method of claim 1, comprising applying a diffusion gradient between the FID signal and the spin echo signal to cause the spin echo signal to be more sensitive to diffusion than when the diffusion gradient is not applied between the FID signal and the spin echo signal.

9. The method of claim 8, where the diffusion gradient is a mono-polar diffusion gradient.

10. The method of claim 9, where the MRF excitation included varying diffusion gradient moments.

11. The method of claim 1, where the acquired NMR signal includes transient signals.

12. The method of claim 1, where the MRF excitation included varying flip angles.

13. The method of claim 1, where the MRF excitation included varying repetition times.

14. The method of claim 1, comprising displaying the quantitative maps.

15. The method of claim 1, comprising:
controlling an NMR apparatus to produce the MRF excitation using the DWDE pulse sequence by applying RF energy to the volume in an object in a series of variable sequence blocks, where a sequence block includes one or more excitation phases, one or more readout phases, and one or more waiting phases,
where the RF energy applied during a sequence block causes the one or more resonant species in the volume to simultaneously produce individual NMR signals, and
where at least one member of the series of variable sequence blocks differs from at least one other member of the series of variable sequence blocks in at least N sequence block parameters, N being an integer greater than one, and
controlling the NMR apparatus to acquire the simultaneously produced individual NMR signals.

16. The method of claim 15, where the sequence block parameters comprise echo time, flip angle, phase encoding, diffusion encoding, flow encoding, radio frequency (RF) pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling.

17. The method of claim 16, comprising:
controlling the NMR apparatus to vary one or more of, the amount of time between sequence blocks in the series of variable sequence blocks, the relative amplitude of RF pulses in sequence blocks in the series of variable sequence blocks, and the relative phase of RF pulses in sequence blocks in the series of variable sequence blocks.

18. The method of claim 1, where the set of known signal evolutions includes signal evolutions outside the set of signal evolutions characterized by:

$$SE = A - Be^{-t/C}$$

where:
SE is a signal evolution,
A is a constant,
B is a constant,
t is time, and
C is a single relaxation parameter.

19. The method of claim 1, where the set of known signal evolutions includes a signal selected from a set of signals described by:

$$SE = \sum_{S=1}^{N_S} \prod_{A=1}^{N_A} \sum_{j=1}^{N_{RF}} R_{i(\alpha)} R_{RF_{ij}(\alpha,\phi)} R(G) E(T1, T1, K) DPdM_0$$

where:
SE is a signal evolution,
$N_S$ is a number of spins,
$N_A$ is a number of sequence blocks,
$N_{RF}$ is a number of RF pulses in a sequence block,
α is a flip angle,
Φ is a phase angle,
Ri(α) is a rotation due to off resonance,
$R_{RFij}(\alpha,\Phi)$ is a rotation due to RF differences,
R(G) is a rotation due to a gradient,
T1 is spin-lattice relaxation,
T2 is spin-spin relaxation,
D is diffusion relaxation,
Pd is proton density,
$E_i$(T1, T2, ... ) is decay due to relaxation differences, and
$M_0$ is the default or natural alignment to which spins align when placed in the main magnetic field.

20. The method of claim 1, where the set of known signal evolutions includes a signal selected from a set of signals described by:

$$SE = \sum_{S=1}^{N_S} \prod_{A=1}^{N_A} \prod_{j=1}^{N_{RF}} R_i(\alpha) R_{RF_{ij}(\alpha,\phi)} R(G) E(T1, T1, K) DPdM_0$$

where:
SE is a signal evolution,
$N_S$ is a number of spins,
$N_A$ is a number of sequence blocks,
$N_{RF}$ is a number of RF pulses in a sequence block,
α is a flip angle,
Φ is a phase angle,
Ri(α) is a rotation due to off resonance,
$R_{RFij}(\alpha,\Phi)$ is a rotation due to RF differences,
R(G) is a rotation due to a gradient,
T1 is spin-lattice relaxation,
T2 is spin-spin relaxation,
D is diffusion relaxation,
Pd is proton density,
$E_i$(T1, T2, ... ) is decay due to relaxation differences, and
$M_0$ is the default or natural alignment to which spins align when placed in the main magnetic field.

21. The method of claim 1, where the set of known signal evolutions includes
a signal selected from a set of signals described by:
$S_i = R_i E_i(S_{i-1})$
where:
$S_0$ is the default or equilibrium magnetization,
$S_i$ is a vector that represents the different components of the magnetization Mx, My, Mz during acquisition block i,
$R_j$ is the combination of rotational effects that occur during acquisition block i, and
$E_i$ is the combination of effects that alter the amount of magnetization in the different states for acquisition block i.

22. The method of claim 1, where the set of known signal evolutions includes a signal selected from a set of signals described by:

$$S_i = R_i E_i \sum_{x=1}^{i-1} R_x E_x(S_x)$$

or $$S_i = R_i E_i \prod_{x=1}^{i-1} R_x E_x(S_x)$$

where:
$S_0$ is the default or equilibrium magnetization,
$S_i$ is a vector that represents the different components of the magnetization Mx, My, Mz during acquisition block i,
$R_i$ is the combination of rotational effects that occur during acquisition block i, and
$E_i$ is the combination of effects that alter the amount of magnetization in the different states for acquisition block i.

23. The method of claim 1, where the set of known signal evolutions includes a signal selected from a set of signals described by:

$$S_i = \sum_{s=1}^{N_S} R_{s,i} E_{s,i}(S_{s,i-1})$$

where:
$S_0$ is the default or equilibrium magnetization,
$N_S$ is the number of spins,
$S_i$ is a vector that represents the different components of the magnetization Mx, My, Mz during acquisition block i,
$R_i$ is the combination of rotational effects that occur during acquisition block i, and
$E_i$ is the combination of effects that alter the amount of magnetization in the different states for acquisition block i.

24. The method of claim 1, where the set of known signal evolutions includes a signal selected from a set of signals described by:

$$S_i = \sum_{s=1}^{N_S} R_{s,i} E_{s,i} \sum_{x=1}^{i-1} R_{s,x} E_{s,x}(S_{s,x})$$

or $$S_i = \sum_{s=1}^{N_S} R_{s,i} E_{s,i} \Pi_{x=1}^{i-1} R_{s,x} E_{s,x}(S_{s,x})$$

where:
$S_0$ is the default or equilibrium magnetization,
$N_S$ is the number of spins,
$S_i$ is a vector that represents the different components of the magnetization Mx, My, Mz during acquisition block i,
$R_i$ is the combination of rotational effects that occur during acquisition block i, and
$E_i$ is the combination of effects that alter the amount of magnetization in the different states for acquisition block i.

25. An apparatus, comprising:
a nuclear magnetic resonance (NMR) logic that receives a first set of data from a magnetic resonance fingerprinting (MRF) apparatus that repetitively and variably samples a (k, t, E) space associated with an object to acquire a set of NMR signals,
where the MRF apparatus applies RF energy to the object according to an MRF diffusion-weighted double-echo (DWDE) pulse sequence,
where the set of NMR signals includes transient-state signals associated with the MRF DWDE pulse sequence, a free induction decay signal, and a spin echo signal,
where members of the first set of data are associated with different points in the (k, t, E) space, where t is time and E includes at least T1, T2, proton density, and apparent diffusion co-efficient, T1 being spin-lattice relaxation, and T2 being spin-spin relaxation, and where one or more of, t and E, vary non-linearly;
a signal logic that produces an NMR signal evolution from the first set of data;
a matching logic that selects, from a collection of stored signal evolutions, a stored signal evolution that matches the NMR signal evolution, and
a quantitative mapping logic that simultaneously produces quantitative maps for T1, T2, proton density, and diffusion associated with the object based, at least in part, on the stored signal evolution that matches the NMR signal evolution and displays the quantitative maps.

26. The apparatus of claim 25, where the MWF-DWDE pulse sequence acquires a free induction decay (FID) signal and a spin echo signal in a single repetition time (TR), where the FID signal is primarily T1 weighted and the spin echo signal is primarily T2 weighted.

27. The apparatus of claim 26, where the MWF-DWDE pulse sequence reads the FID signal using a variable density spiral out readout, and where the MWFDWDE pulse sequence reads the spin echo signal using a variable density spiral in readout.

28. The apparatus of claim 26, where the MWF-DWDE pulse sequence includes a mono-polar diffusion gradient between the FID signal and the spin echo signal.

29. The apparatus of claim 25, where the collection of stored signal evolutions include a signal selected from:

$$SE = \sum_{S=1}^{N_S} \prod_{A=1}^{N_A} \sum_{j=1}^{N_{RF}} R_{i(\alpha)} R_{RF_{ij}(\alpha,\phi)} R(G) E(T1, T1, K) DPdM_0$$

or $$SE = \sum_{S=1}^{N_S} \prod_{A=1}^{N_A} \prod_{j=1}^{N_{RF}} R_i(\alpha) R_{RF_{ij}(\alpha,\phi)} R(G) E(T1, T1, K) DPdM_0$$

where:
SE is a signal evolution,
$N_S$ is a number of spins,
$N_A$ is a number of sequence blocks,
$N_{RF}$ is a number of RF pulses in a sequence block,
α is a flip angle,
Φ is a phase angle,
Ri(α) is a rotation due to off resonance,
$R_{RFij}(\alpha,\Phi)$ is a rotation due to RF differences,
R(G) is a rotation due to a gradient,
T1 is spin-lattice relaxation,
T2 is spin-spin relaxation,
D is diffusion relaxation,
Pd is proton density,
$E_i$(T1, T2, . . . ) is decay due to relaxation differences, and
$M_0$ is the default or natural alignment to which spins align when placed in the main magnetic field.

30. The apparatus of claim 25, where the collection of stored signal evolutions include a signal selected from:

$$S_i = R_i E_i(S_{i-1})$$

or $$S_i = R_i E_i \sum_{x=1}^{i-1} R_x E_x(S_x)$$

or $$S_i = R_i E_i \Pi_{x=1}^{i-1} R_x E_x(S_x)$$

or $$S_i = \sum_{s=1}^{N_s} R_{s,i} E_{s,i}(S_{s,i-1})$$

or $$S_i = \sum_{s=1}^{N_s} R_{s,i} E_{s,i} \sum_{x=1}^{i-1} R_{s,x} E_{s,x}(S_{s,x})$$

or $$S_i = \sum_{s=1}^{N_s} R_{s,i} E_{s,i} \Pi_{x=1}^{i-1} R_{s,x} E_{s,x}(S_{s,x})$$

where:

$S_0$ is the default or equilibrium magnetization, $N_S$ is a number of spins, $S_i$ is a vector that represents the different components of the magnetization Mx, My, Mz during acquisition block i, $R_i$ is the combination of rotational effects that occur during acquisition block i, and $E_i$ is the combination of effects that alter the amount of magnetization in the different states for acquisition block i.

31. A magnetic resonance imaging (MRI) apparatus, comprising:

a data store that stores a dictionary of magnetic resonance fingerprinting (MRF) signal evolutions;

a collection logic that collects a received signal evolution from a tissue experiencing nuclear magnetic resonance (NMR) in response to an MRF excitation applied to the tissue by the MRI apparatus, where the MRF excitation is provided according to a diffusion-weighted double-echo (DWDE) pulse sequence;

a selection logic that selects a member of the dictionary that is most closely related to the signal evolution, and a characterization logic that identifies, for the tissue, from the member, a T1 relaxation value, a T2 relaxation value, a proton density value, and an apparent diffusion co-efficient (ADC) value.

32. The MRI apparatus of claim 31, comprising:

an image logic that produces an MR image from a plurality of signal evolutions received from the tissue based, at least in part, on a plurality of values produced by the characterization logic for T1 relaxation, T2 relaxation, proton density, and ADC.

* * * * *